United States Patent
Lee et al.

(10) Patent No.: US 12,096,660 B2
(45) Date of Patent: Sep. 17, 2024

(54) FOLDABLE DISPLAY APPARATUS

(71) Applicant: Samsung Display Co., Ltd., Yongin-si (KR)

(72) Inventors: Jeoungsub Lee, Yongin-si (KR); Joohyeon Lee, Yongin-si (KR); Jieun Nam, Yongin-si (KR); Juhee Song, Yongin-si (KR); Heonjung Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 251 days.

(21) Appl. No.: 17/379,462

(22) Filed: Jul. 19, 2021

(65) Prior Publication Data

US 2022/0115471 A1    Apr. 14, 2022

(30) Foreign Application Priority Data

Oct. 12, 2020  (KR) .................. 10-2020-0131296

(51) Int. Cl.
*H10K 59/122* (2023.01)
*G09F 9/30* (2006.01)
*H10K 59/80* (2023.01)

(52) U.S. Cl.
CPC ........... *H10K 59/122* (2023.02); *G09F 9/301* (2013.01); *H10K 59/87* (2023.02)

(58) Field of Classification Search
CPC .. H01L 23/562; H05B 33/04; G09G 2380/02; G09G 2380/04; B32B 27/325; H10K 77/111; H10K 2102/311; H10K 59/87–874; H10K 59/10–95
See application file for complete search history.

(56) References Cited

U.S. PATENT DOCUMENTS

| | | |
|---|---|---|
| 7,163,739 B2 | 1/2007 | Koike et al. |
| 10,586,941 B2 | 3/2020 | Lee et al. |
| 10,593,741 B2 | 3/2020 | Khachatryan et al. |

(Continued)

FOREIGN PATENT DOCUMENTS

| | | | |
|---|---|---|---|
| CN | 107357459 A | * 11/2017 | ........... G06F 3/0412 |
| CN | 108550586 A | * 9/2018 | |

(Continued)

OTHER PUBLICATIONS

Plichta, Armin et al., "Flexible Glass Substrates." Flexible Flat Panel Displays., Chichester, UK: John Wiley & Sons, Ltd, 2005. 35-55. Web. p. 119 line 4 (Year: 2005).*

(Continued)

*Primary Examiner* — Bryan R Junge
*Assistant Examiner* — Mario Andres Autore, Jr.
(74) *Attorney, Agent, or Firm* — KILE PARK REED & HOUTTEMAN PLLC

(57) ABSTRACT

A display apparatus includes a display panel including a display element, a first film comprising an elastomeric material and disposed on the display panel, the first film having a first thickness, a first adhesive layer disposed on the first film, the first adhesive layer having a second thickness, and a second adhesive layer disposed between the display panel and the first film and having a third thickness equal to or greater than the second thickness of the first adhesive layer.

21 Claims, 9 Drawing Sheets

(56) References Cited

U.S. PATENT DOCUMENTS

| | | | |
|---|---|---|---|
| 2003/0176124 A1* | 9/2003 | Koike | B32B 27/08 |
| | | | 442/16 |
| 2011/0182076 A1* | 7/2011 | Sherman | G02B 6/0055 |
| | | | 362/297 |
| 2014/0042662 A1* | 2/2014 | Tamada | B29C 39/02 |
| | | | 427/535 |
| 2015/0299519 A1* | 10/2015 | Nishijima | C09J 123/22 |
| | | | 156/60 |
| 2016/0177146 A1* | 6/2016 | Mun | B32B 27/308 |
| | | | 428/220 |
| 2017/0002237 A1* | 1/2017 | Cho | C09J 133/08 |
| 2017/0276317 A1* | 9/2017 | Nishikawa | H10K 50/854 |
| 2018/0342566 A1* | 11/2018 | Khachatryan | B32B 15/08 |
| 2019/0143638 A1 | 5/2019 | Park et al. | |
| 2019/0161650 A1 | 5/2019 | Jozuka et al. | |
| 2020/0133342 A1 | 4/2020 | Choi et al. | |
| 2020/0266368 A1* | 8/2020 | Park | B32B 7/12 |
| 2020/0377768 A1 | 12/2020 | Song et al. | |

FOREIGN PATENT DOCUMENTS

| | | | | |
|---|---|---|---|---|
| KR | 2003-0001494 | | 1/2003 | |
| KR | 10-2017-0059158 | | 5/2017 | |
| KR | 10-2017-0084402 | | 7/2017 | |
| KR | 10-2018-0096448 | | 8/2018 | |
| KR | 10-2018-0130079 | | 12/2018 | |
| KR | 10-2019-0056474 | | 5/2019 | |
| KR | 10-2019-0064461 | | 6/2019 | |
| KR | 10-2019-0094118 | | 8/2019 | |
| KR | 10-2020-0049942 | | 5/2020 | |
| WO | WO-2020124812 A1 * | 6/2020 | | B32B 17/1055 |
| WO | WO-2020151063 A1 * | 7/2020 | | G06F 3/0412 |

OTHER PUBLICATIONS

Dai, Shengyu, et al. "Direct Synthesis of Polar Functionalized Polyethylene Thermoplastic Elastomer." Macromolecules, vol. 53, No. 7, Mar. 23, 2020, pp. 2539-2546, https://doi.org/10.1021/acs.macromol.0c00083. Accessed Dec. 22, 2023. (Year: 2020).*

Santos, T.F., et al. "Influence of Silane Coupling Agent on Shear Thickening Fluids (STF) for Personal Protection." Journal of Materials Research and Technology, vol. 8, No. 5, Sep. 2019, pp. 4032-4039, https://doi.org/10.1016/j.jmrt.2019.07.013. Accessed Jul. 21, 2022. (Year: 2019).*

Sewda, Kamini, and S. N. Maiti. "Dynamic Mechanical Properties of High Density Polyethylene and Teak Wood Flour Composites." Polymer Bulletin, vol. 70, No. 10, Aug. 22, 2013, pp. 2657-2674, https://doi.org/10.1007/s00289-013-0941-0. Accessed Aug. 4, 2022. (Year: 2013).*

Hollister, Sean. "Folding Glass: How, Why, and the Truth of Samsung's Z Flip." The Verge, Feb. 19, 2020, www.theverge.com/2020/2/19/21142728/samsung-foldable-glass-galaxy-z-flip-explained-schott-corning. (Year: 2020).*

Taghizadeh, S.M. and Ghasemi, D. (2011), Rheological and adhesion properties of acrylic pressure-sensitive adhesives. J. Appl. Polym. Sci., 120: 411-418. https://doi.org/10.1002/app.33153 (Year: 2011).*

* cited by examiner

FOLDABLE DISPLAY APPARATUS

CROSS-REFERENCE TO RELATED APPLICATION(S)

This application claims priority to and benefits of Korean Patent Application No. 10-2020-0131296 under 35 U.S.C. § 119, filed on Oct. 12, 2020, in the Korean Intellectual Property Office, the entire contents of which are incorporated herein by reference.

BACKGROUND

1. Technical Field

One or more embodiments relate to display apparatuses, and, to display apparatuses having improved bending characteristics.

2. Description of the Related Art

Recently, display apparatuses that are bended or folded have been actively developed. Such display apparatuses may include various members such as flexible display panels or flexible windows. The various members may be attached to an upper or a lower side of a display panel and may be bent or folded along with the display panel.

The various members are required to have flexibility to be bent or folded. However, when the various members have flexibility, resilience to external impact may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments provide display apparatuses which may prevent or reduce damage to display panels due to an external impact.

Additional aspects will be set forth in part in the description which follows and, in part, will be apparent from the description, or may be learned by practice of the presented embodiments of the disclosure.

According to an aspect of the disclosure, a display apparatus may include a display panel including a display element; a first film comprising an elastomeric material and disposed on the display panel, the first film having a first thickness; a first adhesive layer disposed on the first film, the first adhesive layer having a second thickness; and a second adhesive layer disposed between the display panel and the first film and having a third thickness equal to or greater than the second thickness of the first adhesive layer.

In an embodiment, an elastic modulus of the first film at about −20° C. may be in a range of about 200 MPa to about 2,000 MPa.

In an embodiment, an elastic modulus of the first film at about 85° C. may be in a range of about 100 MPa to about 500 MPa.

In an embodiment, the first thickness may be in a range of about 50 μm to about 150 μm.

In an embodiment, the first film may have a recovery rate of about 50% or more.

In an embodiment, the first adhesive layer may have shear thickening characteristics.

In an embodiment, the second adhesive layer may have shear thickening characteristics.

In an embodiment, a storage modulus of the first adhesive layer at about −20° C. may be about 100 KPa or less.

In an embodiment, a storage modulus of the second adhesive layer at about −20° C. may be about 100 KPa or less.

In an embodiment, a storage modulus of the second adhesive layer at about −20° C. may be equal to or greater than a storage modulus of the first adhesive layer at about −20° C.

In an embodiment, the second thickness of the first adhesive layer may be in a range of about 10 μm to about 50 μm.

In an embodiment, the third thickness of the second adhesive layer may be in a range of about 10 μm to about 50 μm.

In an embodiment, the display apparatus may further include a second film disposed on the first adhesive layer, the second film having a fourth thickness.

In an embodiment, the fourth thickness of the second film may be about 50 μm or less.

In an embodiment, the display apparatus may further include a third film disposed between the first film and the display panel, the third film having a fifth thickness less than the first thickness of the first film.

In an embodiment, the fifth thickness of the third film may be about 50 μm or less.

In an embodiment, the display apparatus may further include a third adhesive layer disposed between the third film and the display panel, the third adhesive layer having a sixth thickness equal to or greater than the third thickness of the second adhesive layer.

In an embodiment, the sixth thickness of the third adhesive layer may be in a range of about 10 μm to about 75 μm.

In an embodiment, the third adhesive layer may have shear thickening characteristics.

In an embodiment, the display element may include an organic light-emitting diode.

BRIEF DESCRIPTION OF THE DRAWINGS

The above and other aspects, features, and advantages of the disclosure will be more apparent from the following description taken in conjunction with the accompanying drawings, in which.

DETAILED DESCRIPTION OF THE EMBODIMENTS

Figure 1:
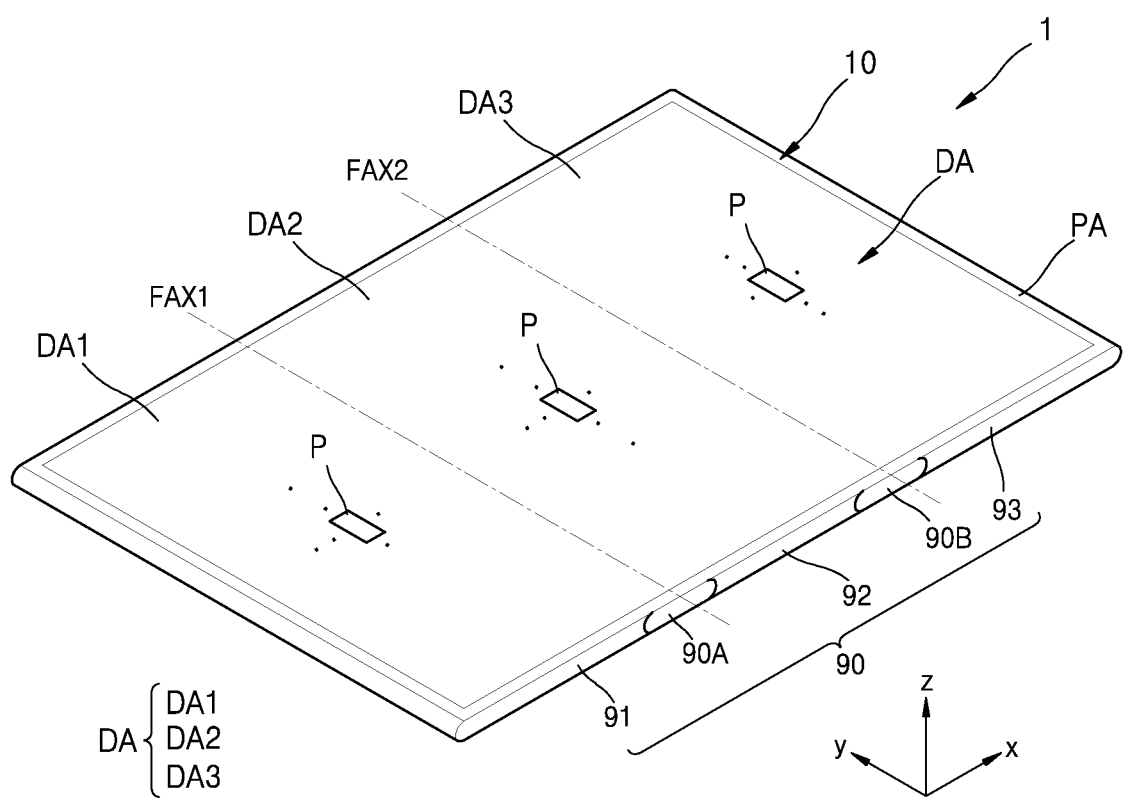
FIGS. 1 and 2 are schematic perspective views of a display apparatus according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The disclosure may, however, be embodied in many different forms and should not be construed as being limited to the embodiments set forth herein. Advantages and features of the disclosure and methods of accomplishing the same may be understood more readily by reference to the following detailed description of embodiments and the accompanying drawings. However, embodiments may be implemented in various forms, not by being limited to the embodiments presented below.

In an embodiment below, terms such as "first" and "second" are used herein merely to describe a variety of constituent elements, but the constituent elements are not limited by the terms. Such terms are used only for the purpose of distinguishing one constituent element from another constituent element. For example, a first element may be referred to as a second element, and similarly, a second element may be referred to as a first element without departing from the scope of the disclosure.

In an embodiment below, an expression used in the singular encompasses the expression of the plural, unless it has a clearly different meaning in the context.

In an embodiment below, it will be further understood that the terms "comprises" and/or "comprising" "includes" and/or "including", "has", "have", and/or "having" and variations thereof used herein specify the presence of stated features or components, but do not preclude the presence or addition of one or more other features or components.

In an embodiment below, it will be understood that when a component, such as a layer, a film, a region, or a plate, is referred to as being "on" another component, the component can be directly on the other component or intervening components may be present thereon.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the drawings, sizes of components in the drawings may be exaggerated for convenience of explanation and for clarity. For example, since sizes and thicknesses of components in the drawings are arbitrarily illustrated for convenience of explanation, the following embodiments are not limited thereto.

In an embodiment below, the meaning that the wiring "extends in the first direction or the second direction" may include not only extending in a substantially linear shape, but also extending substantially in a zigzag or a curve along the first direction or the second direction.

In the following embodiments, when referred to as "in a plan view," this means when an object part is viewed from above, and when it is referred to as "in a cross-section," it means when the cross-section where the object part is cut vertically is viewed from the side. In the following embodiments, when referred to as "overlapping," it includes overlapping "in a plan view" and "in a cross-section."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, one or more embodiments are described in detail with reference to the accompanying drawings. In the description with the drawings, like or corresponding constituent elements are assigned with like reference numerals.

Figure 2:
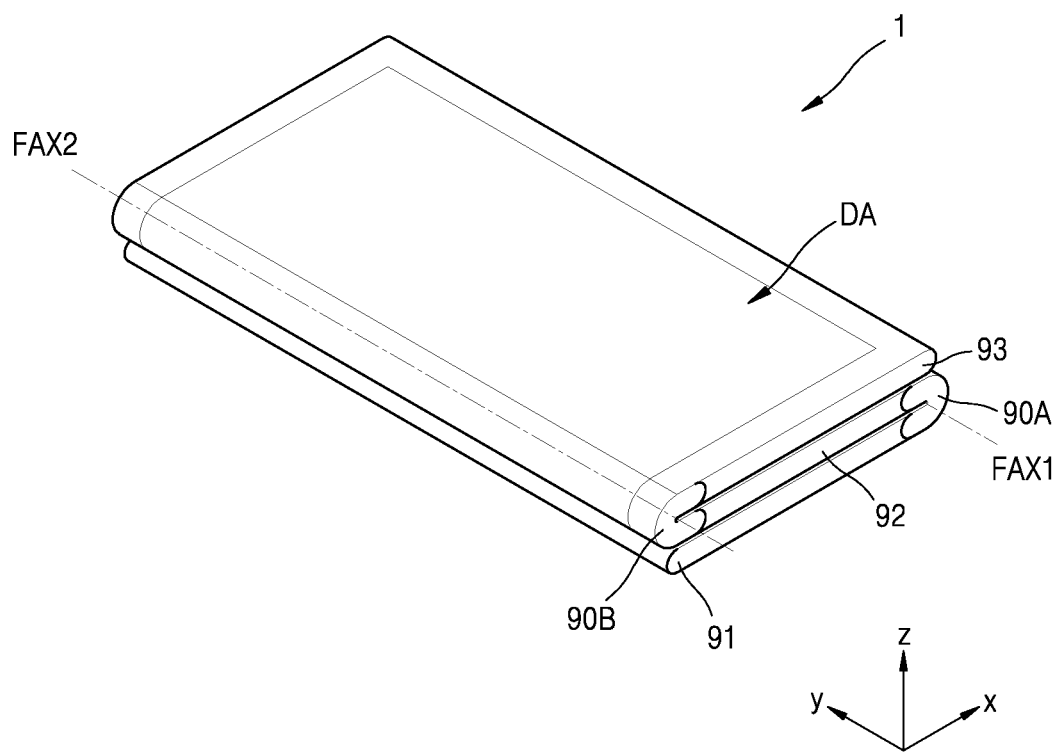

FIGS. 1 and 2 are schematic perspective views of a display apparatus according to an embodiment. In detail, FIG. 1 is a perspective view of a display apparatus 1 in an unfolded state. FIG. 2 is a perspective view of the display apparatus 1 in a folded state.

Referring to FIGS. 1 and 2, the display apparatus 1 may include a display panel 10 and a lower cover 90. The display panel 10 may include a display area DA where an image is displayed and a peripheral area PA arranged or disposed around or adjacent to the display area DA. Pixels P having display elements may be arranged or disposed in the display area DA. The display apparatus 1 may provide an image by using light emitted from the pixels P arranged or disposed in the display area DA, and the peripheral area PA may be a non-display area where the pixels P may not be arranged or disposed. In the figures, "x" may refer to a substantially horizontal direction, "y" may be a direction substantially perpendicular to the "x" direction, and "z" may be referred to as a thickness direction.

The display area DA may include a first display area DA1, a second display area DA2, and a third display area DA3. The pixels P may be arranged or disposed in each of the first display area DA1, the second display area DA2 and the third display area DA3. The display apparatus 1 may provide an image through the pixels P arranged or disposed in the first display area DA1, the second display area DA2 and the third display area DA3. The first display area DA1, the second display area DA2 and the third display area DA3 may be surrounded by or adjacent to the peripheral area PA.

In the following description, an organic light-emitting display apparatus is described as an example of the display apparatus 1 according to an embodiment, the display apparatus of the disclosure is not limited thereto. As an embodiment, the display apparatus 1 according to an embodiment may include a display apparatus such as an inorganic light-emitting display apparatus (inorganic light-emitting display or inorganic electroluminescent (EL) display), or a quantum dot light-emitting display. For example, an emission layer of a display element of the display apparatus 1 may include an organic material, an inorganic material, quantum dots, an organic material with quantum dots, or an inorganic material with quantum dots.

In an embodiment, the display panel 10 may be a flexible display panel that has flexibility so as to be easily bendable, foldable, or rollable. For example, the display panel 10 may include a foldable display panel that is folded and unfolded, a curved display panel having a substantially curved display surface, a bended display panel in which an area other than a display surface is bent, a rollable display panel that is rollable or unrollable, and a stretchable display panel that is stretchable. In an embodiment, the display panel 10 may include a rigid display panel that has rigidity so as not to be easily bent.

In an embodiment, the display panel 10 may include a first folding axis FAX1 and a second folding axis FAX2. The display panel 10 may be folded with respect to the first folding axis FAX1 and the second folding axis FAX2.

The first display area DA1 and the second display area DA2 may be defined by the first folding axis FAX1 arranged or disposed therebetween. Furthermore, the second display area DA2 and the third display area DA3 may be defined by the second folding axis FAX2 arranged or disposed therebetween.

The lower cover 90 may form an appearance of a lower surface of the display apparatus 1. The lower cover 90 may include all of plastic, metal, or plastic and metal. The lower cover 90 may include a first part 91, a second part 92, and a third part 93, which support the display panel 10. The lower cover 90 may be folded with respect to the first folding axis FAX1 between the first part 91 and the second part 92. Furthermore, the lower cover 90 may be folded with respect to the second folding axis FAX2 between the second part 92 and the third part 93.

In an embodiment, a first hinge portion 90A may be provided or disposed between the first part 91 and the second part 92, and a second hinge portion 90B may be provided or disposed between the second part 92 and the third part 93.

In an embodiment, the first display area DA1 and the second display area DA2 may be folded to face each other with respect to the first folding axis FAX1. In other words, the first part 91 and the second part 92 may be folded to face each other with respect to the first folding axis FAX1. In an embodiment, the first display area DA1 and the second display area DA2 may be folded not to face each other with respect to the first folding axis FAX1.

In an embodiment, the second display area DA2 and the third display area DA3 may be folded not to face each other with respect to the second folding axis FAX2. In other words, the second part 92 and the third part 93 may be folded to face each other with respect to the second folding axis FAX2. In an embodiment, the second display area DA2 and the third display area DA3 may be folded to face each other with respect to the second folding axis FAX2.

In an embodiment, for a case of in-folding in which the first display area DA1 and the second display area DA2 are folded to face each other, a radius of curvature of a folded part may be R5 or less. For example, for the case of in-folding in which the first display area DA1 and the second display area DA2 are folded to face each other, the radius of curvature of a folded part may be R3 or less or R1 or less. In this state, R5 indicates the degree of which a circle with a radius of 5 mm is bent, R3 indicates the degree of which a circle with a radius of 3 mm is bent, and R1 indicates the degree of which a circle with a radius of 1 mm is bent.

In an embodiment, for a case of out-folding in which the second display area DA2 and the third display area DA3 are folded not to face each other, a radius of curvature of a folded part may be R5 or less. For example, for the case of out-folding in which the second display area DA2 and the third display area DA3 are folded not to face each other, the radius of curvature of a folded part may be R4 or less. In this state, R4 indicates the degree of which a circle with a radius of 4 mm is bent.

Figure 3:
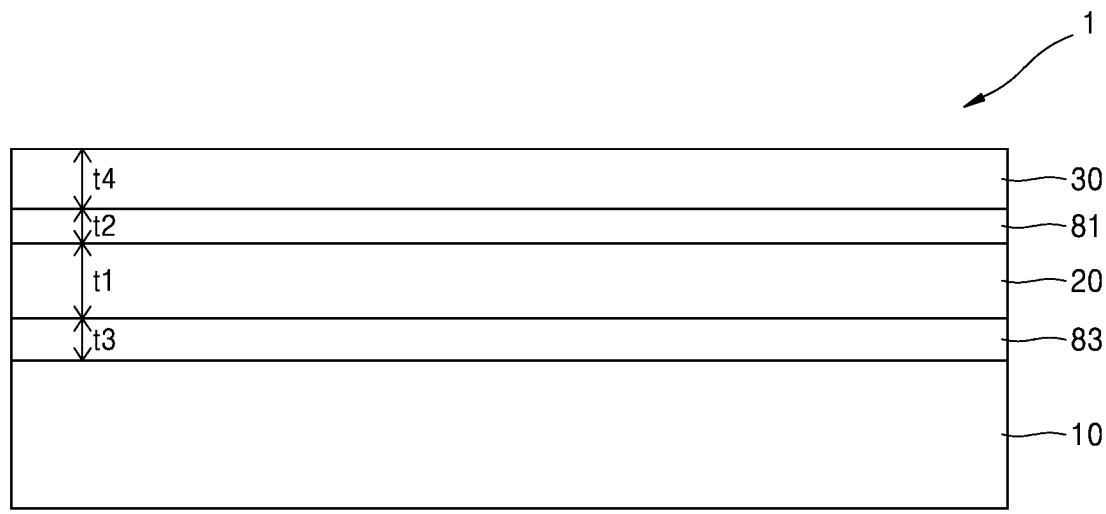
FIG. 3 is a schematic cross-sectional view of a display apparatus according to an embodiment.

FIG. 3 is a schematic cross-sectional view of a display apparatus according to an embodiment.

Referring to FIG. 3, the display apparatus 1 may include the display panel 10. A first film 20 may be arranged or disposed on the display panel 10, a first adhesive layer 81 may be arranged or disposed on the first film 20, and a second adhesive layer 83 may be arranged or disposed between the display panel 10 and the first film 20.

The first film 20 may be arranged or disposed on one or a surface of the display panel 10. The first film 20 that may be arranged or disposed on one or a surface of the display panel 10 may have a first thickness t1. In an embodiment, the first thickness t1 may be in a range of about 50 μm to about 150 μm. In a case that the first thickness t1 of the first film 20 is less than about 50 μm, the display panel 10 may be damaged by an external impact to the display apparatus 1. In contrast, in a case that the first thickness t1 of the first film 20 exceeds about 150 μm, the folding characteristics of the display apparatus 1 may deteriorate. Accordingly, in a case that the first thickness t1 of the first film 20 is in a range of about 50 μm to about 150 μm, the damage of the display panel 10 due to an external impact may be prevented or reduced and simultaneously, the display apparatus 1 may be easily folded.

The first film 20 may be a highly elastic and highly recoverable film. In an embodiment, the first film 20 may include an elastomeric material. As the first film 20 may include an elastomeric material, stress generated in a case that the display apparatus 1 is bent or folded is reduced so that the folding characteristics of the display apparatus 1 may be improved and simultaneously repulsion and recovery characteristics of the display apparatus 1 may be improved.

In an embodiment, the first film 20 may have an elastic modulus in a range of about 200 MPa to about 2,000 MPa at about −20° C. and an elastic modulus in a range of about 100 MPa to about 500 MPa at about 85° C.

In an embodiment, the recovery rate of the first film 20 may be about 50% or more. In this state, the recovery rate of the first film 20 may be obtained by performing a 10% or approximate 10% reciprocating tensile test 100 cye. on the first film 20 by using a universal testing machine (UTM) and then calculating a recovery level as a remaining strain.

As the first film 20 has highly elastic and highly recoverable characteristics, the display apparatus 1 may have flexible flexibility and simultaneously superior recovery power, and thus scratch resistance and impact resistance of the display apparatus 1 may be improved.

The first adhesive layer 81 may be arranged or disposed on the first film 20. The first adhesive layer 81 may include one of a pressure sensitive adhesive (PSA), an optically clear adhesive (OCA), and optical clear resin (OCR). For example, the first adhesive layer 81 may be a PSA.

In an embodiment, the first adhesive layer 81 may include a material having shear thickening characteristics. As the first adhesive layer 81 may include a material having shear thickening characteristics, the first adhesive layer 81 may have shear thickening characteristics. In this state, the shear thickening may mean a characteristic that a storage modulus G' increases when an object is deformed according to applied stress.

Figure 4:
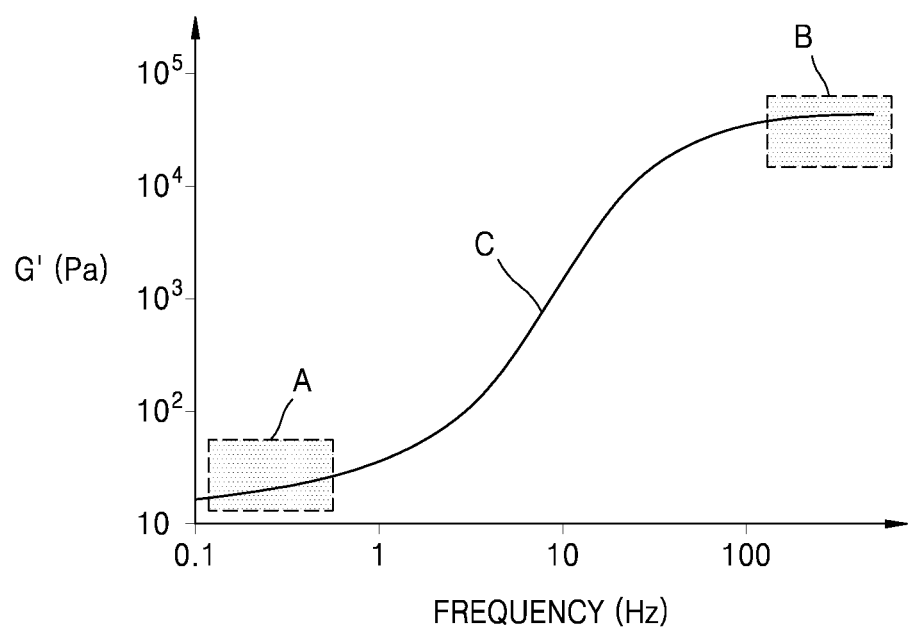
FIG. 4 is a graph for describing a case in which a first adhesive layer of a display apparatus according to an embodiment has shear thickening characteristics.

FIG. 4 is a graph for describing a case in which a first adhesive layer of a display apparatus according to an embodiment has shear thickening characteristics. In FIG. 4, "Frequency (Hz)" means an external impact. Furthermore, in FIG. 4, the area A is an area to which no external impact is applied, and an area B is an area to which an external impact is applied. A graph C shows a change of the storage modulus G' of the first adhesive layer 81 in a case that an external impact is applied.

Referring to FIG. 4, in an embodiment, the first adhesive layer 81 having shear thickening characteristics may have the storage modulus G' of about 100 Pa or less in a level of about 1 Hz or less (the area A). As the first adhesive layer 81 having shear thickening characteristics has the storage modulus G' of about 100 Pa or less in an area having no external impact (the area A), the display apparatus 1 may be easily folded.

Furthermore, the first adhesive layer 81 having shear thickening characteristics may have the storage modulus G' of about 10 KPa or more in a level of about 100 Hz or more (the area B). Accordingly, in a case that the first adhesive layer 81 has shear thickening characteristics, the storage modulus G' may be instantly increased against an external impact such as a pen drop.

In an embodiment, the first adhesive layer 81 having shear thickening characteristics may move like the graph C. For example, the first adhesive layer 81 having shear thickening characteristics may have the storage modulus G' of about 100 Pa or less in a level of about 1 Hz or less (the area A), and in a case that there is an external impact such as a pen drop, the storage modulus G' may be instantly increased.

Accordingly, as the first adhesive layer 81 has shear thickening characteristics, the first adhesive layer 81 has a low storage modulus G' in a case that there is no external impact so that the display apparatus 1 may be easily folded, and in a case that an external impact such as a pen drop is applied to the first adhesive layer 81, the storage modulus G' of the first adhesive layer 81 may be instantly increased, and thus the impact resistance of the display apparatus 1 may be improved.

In an embodiment, the storage modulus G' of the first adhesive layer 81 measured at about −20° C. may be about 100 KPa or less. For example, the storage modulus G' of the first adhesive layer 81 measured at about −20° C. may be about 10 KPa or more and about 100 KPa or less, and may be variously changed, for example, about 1 KPa or more and about 100 KPa or less, and the like within the spirit and the scope of the disclosure.

Referring back to FIG. 3, the first adhesive layer 81 may have a second thickness t2. For example, the second thickness t2 may be in a range of about 10 μm to about 50 μm. In a case that the second thickness t2 of the first adhesive layer 81 is less than about 10 μm, the first adhesive layer 81 has the storage modulus G' that is lower than a preset value so that the impact resistance of the display apparatus 1 may deteriorate. Furthermore, the first adhesive layer 81 may be arranged or disposed between films to reduce strain during folding. In a case that the second thickness t2 of the first adhesive layer 81 is less than about 10 μm, folding strain increases so that the folding characteristics of the display apparatus 1 may deteriorate. In contrast, in a case that the second thickness t2 of the first adhesive layer 81 exceeds about 50 μm, a buckling phenomenon that an object may be deformed from the original shape by failing to withstand a force applied from inside or outside occurs so that the folding characteristics of the display apparatus 1 may deteriorate. Accordingly, in a case that the second thickness t2 of the first adhesive layer 81 is in a range of about 10 μm to about 50 μm, the impact resistance and folding characteristics of the display apparatus 1 may be improved.

The second adhesive layer 83 may be provided or disposed between the first film 20 and the display panel 10. The second adhesive layer 83 may include one of PSA, OCA, and OCR. For example, the second adhesive layer 83 may include PSA.

In an embodiment, the second adhesive layer 83 may include a material having shear thickening characteristics. As the second adhesive layer 83 may include a material having shear thickening characteristics, the second adhesive layer 83 may have shear thickening characteristics.

As the second adhesive layer 83 has shear thickening characteristics, the second adhesive layer 83 has a low storage modulus G' in a case that there is no external impact so that the display apparatus 1 may be easily folded, and in a case that an external impact such as a pen drop is applied, the storage modulus G' of the second adhesive layer 83 may be instantly increased so that the impact resistance of the display apparatus 1 may be improved.

In an embodiment, the storage modulus G' of the second adhesive layer 83 measured at about −20° C. may be about 100 KPa or less. For example, the storage modulus G' of the second adhesive layer 83 measured at about −20° C. may be about 10 KPa or more and about 100 KPa or less, and may be variously changed, for example, about 1 KPa or more and about 100 KPa or less, and the like within the spirit and the scope of the disclosure.

In an embodiment, the storage modulus G' of the second adhesive layer 83 measured at about −20° C. may be the same as or may be substantially the same as the storage modulus G' of the first adhesive layer 81 measured at about −20° C. For example, the storage modulus G' of the second adhesive layer 83 measured at about −20° C. may be greater than the storage modulus G' of the first adhesive layer 81 measured at about −20° C.

The second adhesive layer 83 may have a third thickness t3. For example, the third thickness t3 may be in a range of about 10 μm to about 50 μm. For example, the third thickness t3 may be in a range of about 10 μm to about 75 μm. In a case that the third thickness t3 of the second adhesive layer 83 is less than about 10 μm, the second adhesive layer 83 has a storage modulus G' lower than a preset value, and thus the impact resistance of the display apparatus 1 may deteriorate. Furthermore, the second adhesive layer 83 that may be arranged or disposed between films may reduce strain during folding, in a case that the third thickness t3 of the second adhesive layer 83 is less than about 10 μm, folding strain increases so that the folding characteristics of the display apparatus 1 may deteriorate. In contrast, in a case that the third thickness t3 of the second adhesive layer 83 exceeds about 50 μm, a buckling phenomenon occurs so that the folding characteristics of the display apparatus 1 may deteriorate. Accordingly, in a case that the third thickness t3 of the second adhesive layer 83 is in a range of about 10 μm to about 50 μm, the impact resistance and folding characteristics of the display apparatus 1 may be improved.

A second film 30 may be arranged or disposed on the first adhesive layer 81. The second film 30 that may be arranged or disposed on the first adhesive layer 81 may have a fourth thickness t4. In an embodiment, the fourth thickness t4 may be about 50 μm or less. For example, the fourth thickness t4 may be in a range of about 20 μm to about 50 μm, and may be variously changed, for example, in a range of about 10 μm to about 50 μm, in a range of about 5 μm to about 50 μm, and the like within the spirit and the scope of the disclosure. In a case that the fourth thickness t4 of the second film 30 is less than about 20 μm, the thickness of the second film 30 may be thin so that the display panel 10 may be damaged by external impact. In a case that the fourth thickness t4 of the second film 30 exceeds about 50 μm, the thicknesses of the layers provided or disposed on the display panel 10 increase so that the folding characteristics of the display apparatus 1 may deteriorate. Accordingly, in a case that the fourth thickness t4 of the second film 30 is in a range of about 20 μm to about 50 μm, the damage to the display panel 10 due to external impact may be prevented or reduced, and simultaneously, the display apparatus 1 may be easily folded.

In an embodiment, the second film 30 may include reinforced glass or ultra thin glass (UTG), or transparent polyimide or colorless polyimide (CPI).

Figure 5:
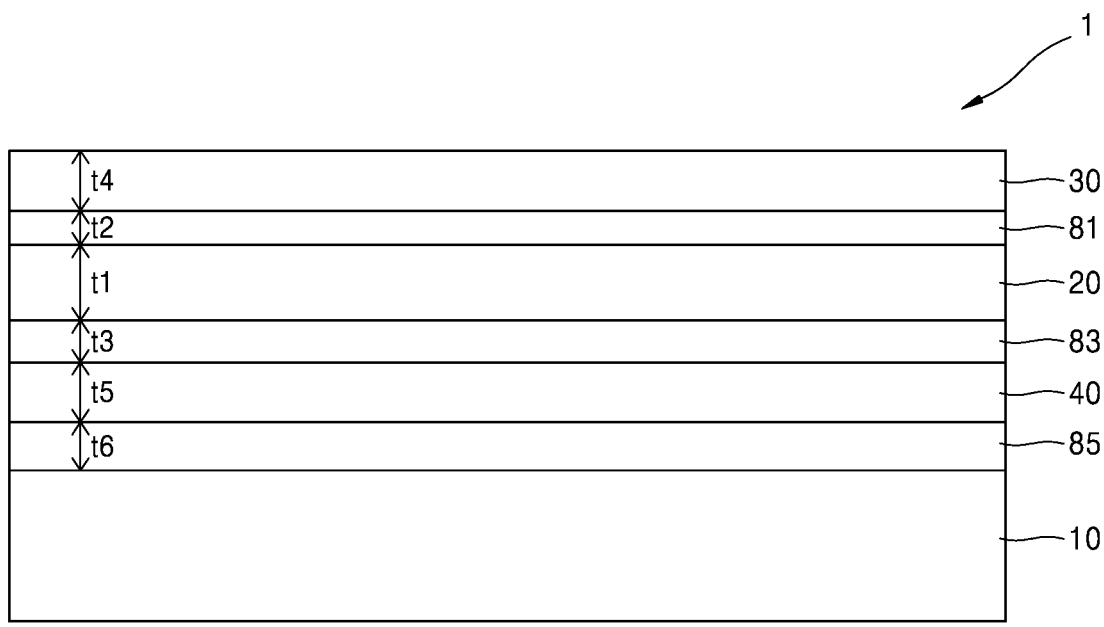
FIG. 5 is a schematic cross-sectional view of a display apparatus according to an embodiment.

FIG. 5 is a schematic cross-sectional view of a display apparatus according to an embodiment. The embodiment of FIG. 5 may be different from the embodiment of FIG. 3 in that a third film 40 and a third adhesive layer 85 may be further provided or disposed between the display panel 10 and the first film 20. In FIG. 5, like reference numerals as those of FIG. 3 denote like constituent elements, and redundant descriptions thereof are omitted.

Referring to FIG. 5, the third film 40 may be arranged or disposed between the display panel 10 and the first film 20. In an embodiment, the third film 40 may be arranged or disposed under or below the second adhesive layer 83. The third film 40 may have a fifth thickness t5. In an embodiment, the fifth thickness t5 may be about 50 μm or less. For example, the fifth thickness t5 may be in a range of about 20 μm to about 50 μm, and may be variously changed, for example, in a range of about 10 μm to about 50 μm, in a range of about 5 μm to about 50 μm, and the like within the spirit and the scope of the disclosure. In a case that the fifth thickness t5 of the third film 40 is less than about 20 μm, the thickness of the third film 40 may be thin so that the display panel 10 may be damaged by external impact. In a case that the fifth thickness t5 of the third film 40 exceeds about 50 μm, the thicknesses of the layers provided or disposed above the display panel 10 increase so that the folding characteristics of the display apparatus 1 may deteriorate. Accordingly, in a case that the fifth thickness t5 of the third film 40 is in a range of about 20 μm to about 50 μm, damage to the display panel 10 by external impact may be prevented or reduced, and simultaneously, the display apparatus 1 may be easily folded.

In an embodiment, the third film 40 may include reinforced glass or UTG, or transparent polyimide or CPI. In an embodiment, at least one of the second film 30 and the third film 40 may include reinforced glass or UTG.

The third adhesive layer 85 may be provided or disposed between the display panel 10 and the third film 40. The third adhesive layer 85 may include one of PSA, OCA, and OCR. For example, the third adhesive layer 85 may include PSA.

In an embodiment, the third adhesive layer 85 may include a material having shear thickening characteristics. As the third adhesive layer 85 may include a material having shear thickening characteristics, the third adhesive layer 85 may have shear thickening characteristics.

As the third adhesive layer 85 has shear thickening characteristics, in a case that there is no external impact, the third adhesive layer 85 has a low storage modulus G' so that the display apparatus 1 may be easily folded, and in a case that an external impact such as a pen drop is applied, the storage modulus G' of the third adhesive layer 85 may be instantly increased so that the impact resistance of the display apparatus 1 may be improved.

In an embodiment, the storage modulus G' of the third adhesive layer 85 measured at about −20° C. may be about 120 KPa or less. For example, the storage modulus G' of the third adhesive layer 85 measured at about −20° C. may be about 10 KPa or more and about 120 KPa or less, and may be variously changed, for example, about 1 KPa or more and about 120 KPa or less, and the like within the spirit and the scope of the disclosure.

In an embodiment, the storage modulus G' of the third adhesive layer 85 measured at about −20° C. may be greater than the storage modulus G' of the first adhesive layer 81 measured at about −20° C. and the storage modulus G' of the second adhesive layer 83 measured at about −20° C.

The third adhesive layer 85 may have a sixth thickness t6. For example, the sixth thickness t6 may be in a range of about 10 μm to about 75 μm. In a case that the sixth thickness t6 of the third adhesive layer 85 is less than about 10 μm, the third adhesive layer 85 has a storage modulus G' lower than a preset value so that the impact resistance of the display apparatus 1 may deteriorate. Furthermore, the third adhesive layer 85 may be arranged or disposed between films and may reduce strain during folding, and in a case that the sixth thickness t6 of the third adhesive layer 85 is less than about 10 µm, folding strain increases so that the folding characteristics of the display apparatus 1 may deteriorate. In contrast, in a case that the sixth thickness t6 of the third adhesive layer 85 exceeds about 75 µm, a buckling phenomenon occurs so that the folding characteristics of the display apparatus 1 may deteriorate. Accordingly, in a case that the sixth thickness t6 of the third adhesive layer 85 is in a range of about 10 µm to about 75 µm, the impact resistance and folding characteristics of the display apparatus 1 may be improved.

In an embodiment, at least one of the first adhesive layer 81, the second adhesive layer 83, or the third adhesive layer 85 may have a material having shear thickening characteristics so as to have shear thickening characteristics. For example, the first adhesive layer 81 may include a material having shear thickening characteristics, and the second adhesive layer 83 and the third adhesive layer 85 may not include a material having shear thickening characteristics. For example, various changes are possible, for example, the first adhesive layer 81 and the second adhesive layer 83 may include a material having shear thickening characteristics, and the third adhesive layer 85 may not include a material having shear thickening characteristics. For example, all of the first adhesive layer 81, the second adhesive layer 83, and the third adhesive layer 85 may include a material having shear thickening characteristics so as to have shear thickening characteristics.

In an embodiment, the second film 30 and the third film 40 provided or disposed above the display panel 10 may protect the display panel 10 from external impact.

Figure 6:
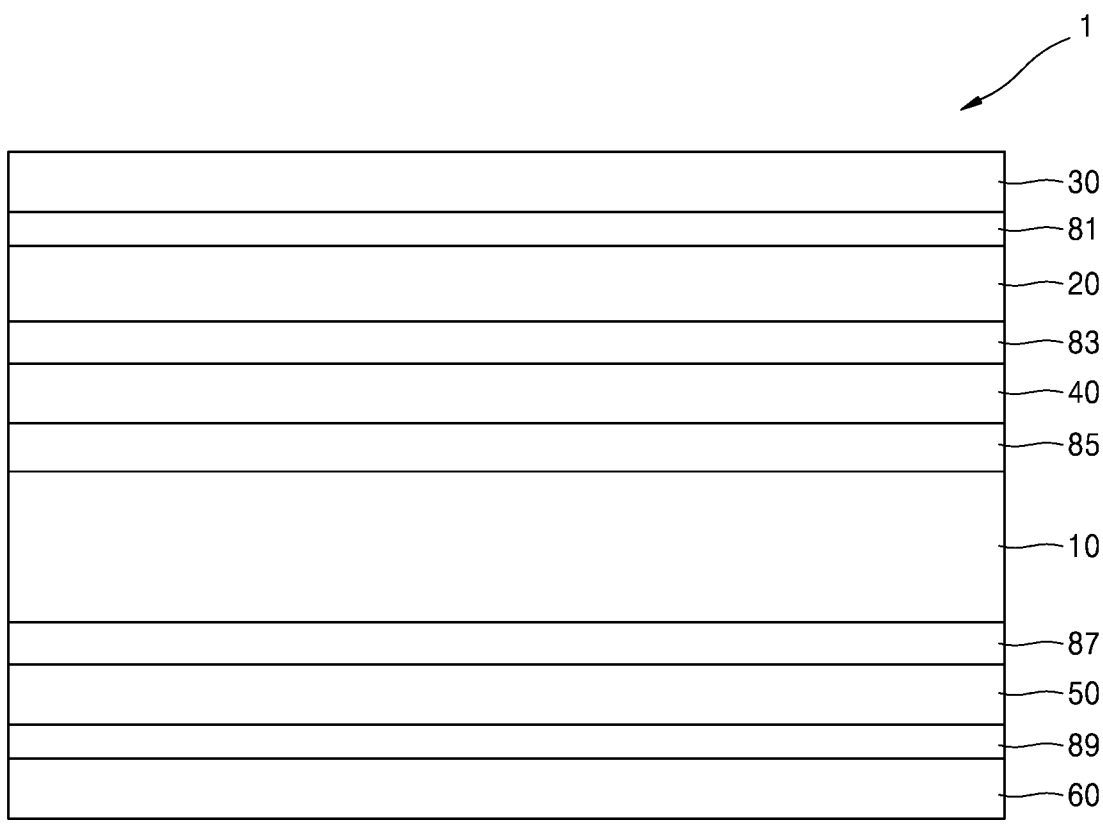
FIG. 6 is a schematic cross-sectional view of a display apparatus according to an embodiment.

FIG. 6 is a schematic cross-sectional view of a display apparatus according to an embodiment. The embodiment of FIG. 5 may be different from the embodiment of FIG. 5 in that a fourth film 50, a fifth film 60, a fourth adhesive layer 87, and a fifth adhesive layer 89 may be arranged or disposed on the other or another surface of the display panel 10 opposite to one surface or a surface of the display panel 10. In FIG. 6, like reference numerals as those of FIG. 5 denote like constituent elements, and redundant descriptions thereof are omitted.

Referring to FIG. 6, the fourth film 50, the fifth film 60, the fourth adhesive layer 87, and the fifth adhesive layer 89 may be arranged or disposed above the other or another surface opposite to the one surface or a surface of the display panel 10.

The fourth film 50 may be arranged or disposed on the other surface or another surface of the display panel 10. The fourth film 50 may be arranged or disposed on the other surface or another surface opposite to the one surface or a surface of the display panel 10 and may protect the display panel 10 from external impact.

The fourth adhesive layer 87 may be provided or disposed between the display panel 10 and the fourth film 50. The fourth adhesive layer 87 may include one of PSA, OCA, and OCR. For example, the fourth adhesive layer 87 may include PSA.

In an embodiment, the fourth adhesive layer 87 may include a material having shear thickening characteristics. As the fourth adhesive layer 87 may include a material having shear thickening characteristics, the fourth adhesive layer 87 may have shear thickening characteristics.

As the fourth adhesive layer 87 has shear thickening characteristics, in a case that there is no external impact, the fourth adhesive layer 87 has a low storage modulus G' so that the display apparatus 1 may be easily folded, and in a case that an external impact such as a pen drop is applied, the storage modulus G' of the fourth adhesive layer 87 may instantly increase so that the impact resistance of the display apparatus 1 may be improved.

The fifth film 60 may be arranged or disposed under or below the fourth adhesive layer 87. The fifth film 60 may be arranged or disposed on the other surface opposite to the one surface or a surface of the display panel 10 and may protect the display panel 10 from external impact.

The fifth adhesive layer 89 may be arranged or disposed above the fifth film 60. The fifth adhesive layer 89 may include one of PSA, OCA, and OCR. For example, the fifth adhesive layer 89 may include PSA.

In an embodiment, the fifth adhesive layer 89 may include a material having shear thickening characteristics. As the fifth adhesive layer 89 may include a material having shear thickening characteristics, the fifth adhesive layer 89 may have shear thickening characteristics.

As the fifth adhesive layer 89 has shear thickening characteristics, in a case that there is no external impact, the fifth adhesive layer 89 has a low storage modulus G' so that the display apparatus 1 may be easily folded, and in a case that an external impact such as a pen drop is applied, the storage modulus G' of the fifth adhesive layer 89 may instantly increase so that the impact resistance of the display apparatus 1 may be improved.

In an embodiment, the fourth adhesive layer 87 may include a material having shear thickening characteristics, and the fifth adhesive layer 89 may not include a material having shear thickening characteristics. For example, the fourth adhesive layer 87 may include a material having shear thickening characteristics, and the fifth adhesive layer 89 may include a material having shear thickening characteristics. For example, both of the fourth adhesive layer 87 and the fifth adhesive layer 89 include a material having shear thickening characteristics, or both of the fourth adhesive layer 87 and the fifth adhesive layer 89 may not include a material having shear thickening characteristics.

In an embodiment, the fourth film 50 and the fifth film 60 provided or disposed on the other surface of the display panel 10 may protect the display panel 10 from external impact.

Figure 7:
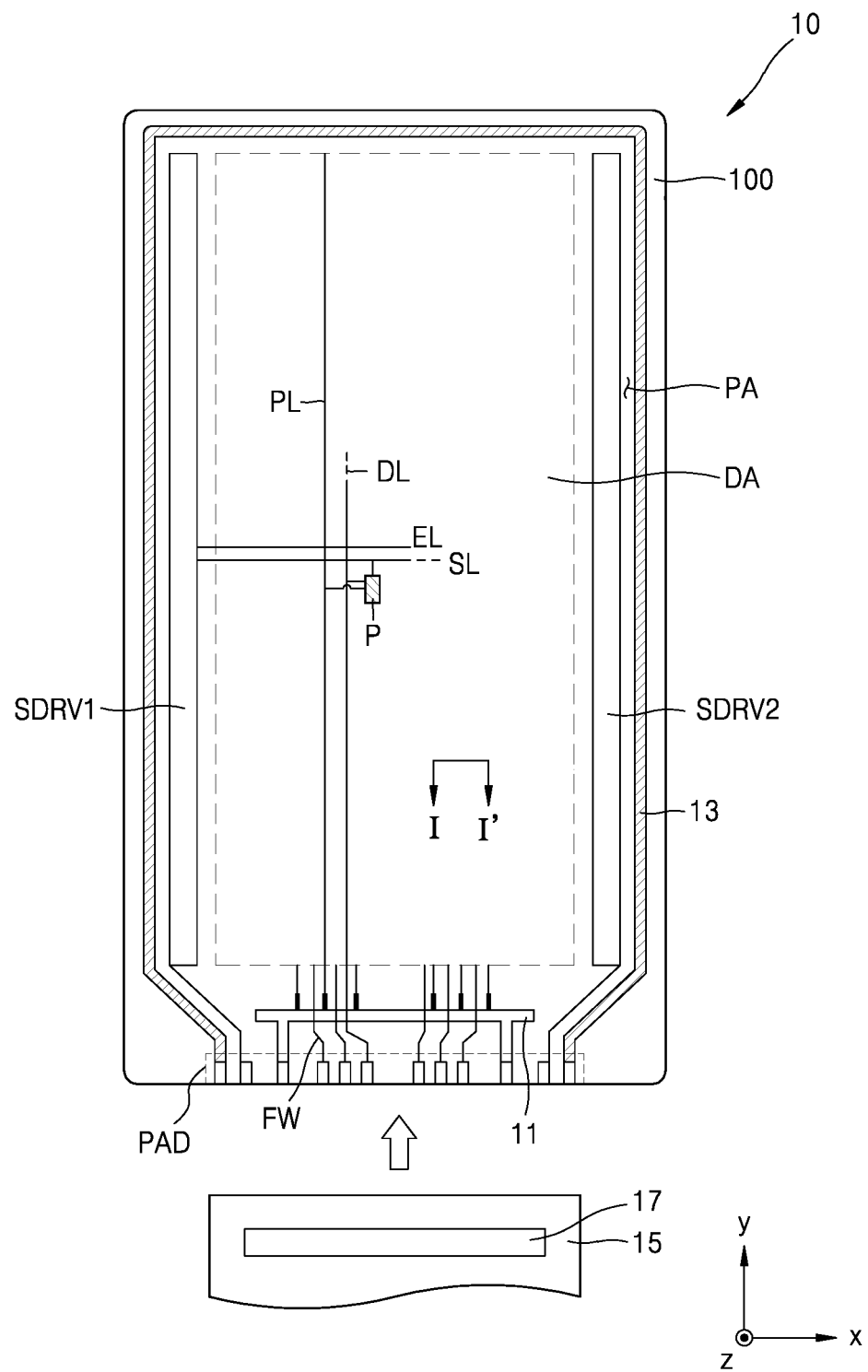
FIG. 7 is a schematic plan view of a display panel to be included in the display apparatus of FIG. 1.

FIG. 7 is a schematic plan view of a display panel to be included in the display apparatus of FIG. 1.

Referring to FIG. 7, various constituent elements constituting the display panel 10 may be arranged or disposed on a substrate 100. The substrate 100 may include the peripheral area PA surrounding or adjacent to the display area DA and the display area DA. The pixels P may be arranged or disposed in display area DA. Each of the pixels P may be implemented by a display element such as an organic light-emitting diode (OLED). Each of the pixels P may emit, for example, red, green, blue, or white light. The display area DA may be covered with or overlapped by a seal member and protected from external air, moisture, and the like within the spirit and the scope of the disclosure.

Each of pixel circuits for driving the pixels P may be electrically connected to outer circuits arranged or disposed in the peripheral area PA. A first scan driving circuit SDRV1, a second scan driving circuit SDRV2, a terminal portion PAD, a driving voltage supply line 11, and a common voltage supply line 13 may be arranged or disposed in the peripheral area PA.

The first scan driving circuit SDRV1 may apply a scan signal to each of the pixel circuits for driving the pixels P through a scan line SL. The first scan driving circuit SDRV1 may apply a light-emitting control signal to each pixel circuit through a light-emitting control line EL. The second scan driving circuit SDRV2 may be located or disposed at the opposite side of the first scan driving circuit SDRV1 with respect to the display area DA, and may be approximately parallel to the first scan driving circuit SDRV1. Some or a number of the pixel circuits of the pixels P of the display area DA may be electrically connected to the first scan driving circuit SDRV1, and the other may be electrically connected to the second scan driving circuit SDRV2.

The terminal portion PAD may be arranged or disposed at one or a side of the substrate 100. The terminal portion PAD may be electrically connected to a display circuit board 15 by being exposed and not covered with or overlapped by an insulating layer. A display driving portion 17 may be arranged or disposed on the display circuit board 15.

The display driving portion 17 may generate a control signal that is transmitted to the first scan driving circuit SDRV1 and the second scan driving circuit SDRV2. The display driving portion 17 generate a data signal, and the generated data signal may be transmitted to the pixel circuit of the pixels P through a fan-out wiring FW, and a data line DL electrically connected to the fan-out wiring FW.

The display driving portion 17 may supply a driving voltage ELVDD to the driving voltage supply line 11 and a common voltage ELVSS to the common voltage supply line 13. The driving voltage ELVDD may be applied to the pixel circuit of the pixels P through a driving voltage line PL electrically connected to the driving voltage supply line 11, and the common voltage ELVSS may be electrically connected to the common voltage supply line 13 and applied to a counter electrode of the display element.

The driving voltage supply line 11 may extend in an x direction under or below the display area DA. The common voltage supply line 13 has a substantially loop shape with one or an open side and may partially surround the display area DA.

Figure 8:
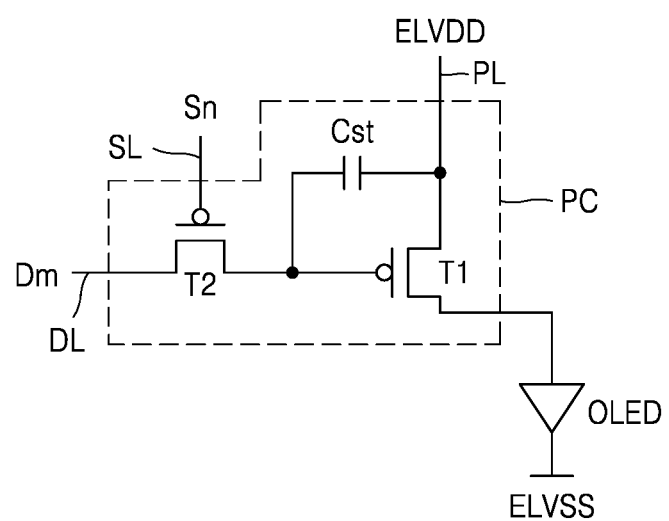
FIGS. 8 and 9 are equivalent circuit diagrams of a pixel circuit for driving a pixel, according to an embodiment.
Figure 9:
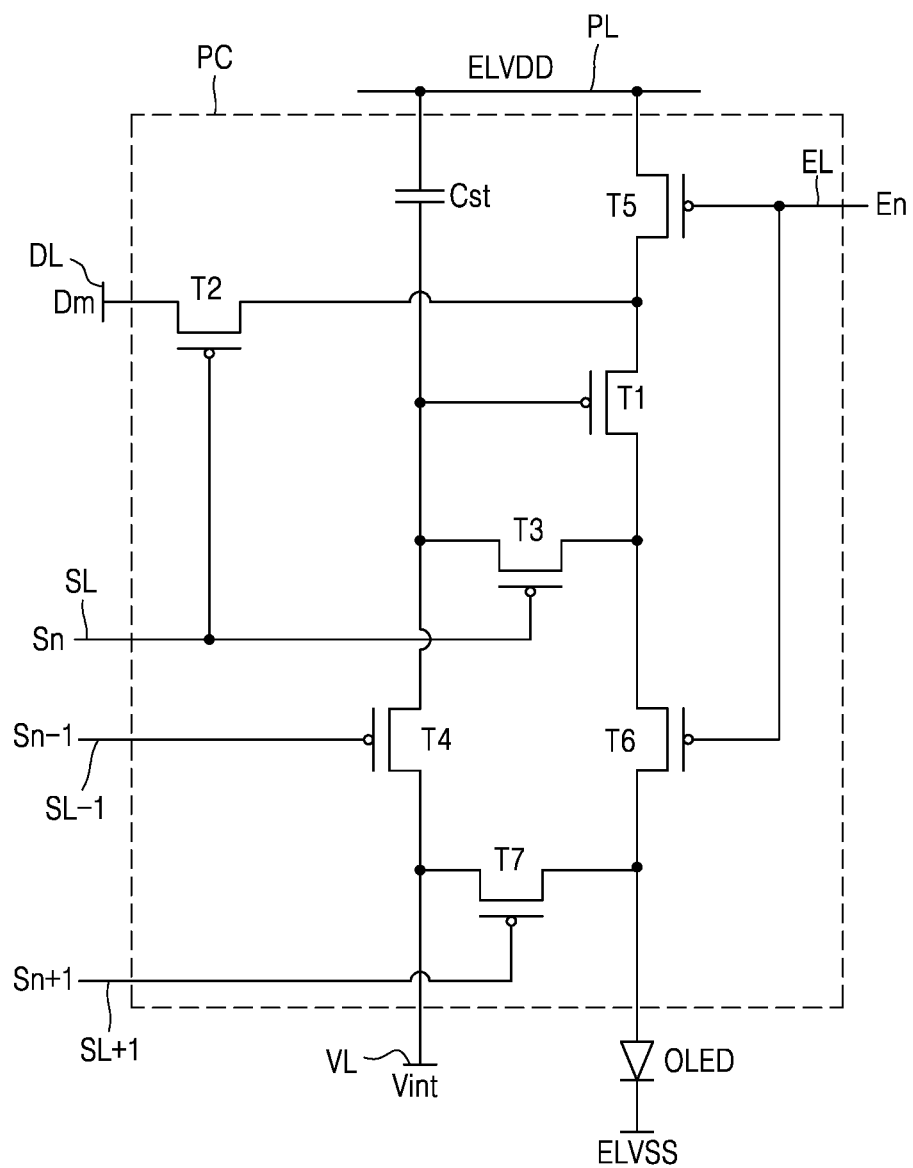

FIGS. 8 and 9 are equivalent circuit diagrams of a pixel circuit for driving a pixel according to an embodiment.

Referring to FIG. 8, a pixel circuit PC may be electrically connected to an organic light-emitting diode OLED, thereby implementing light emission of pixels. The pixel circuit PC may include a driving thin film transistor T1, a switching thin film transistor T2, and a storage capacitor Cst. The switching thin film transistor T2 is electrically connected to the scan line SL and the data line DL, and may transmit a data signal Dm input through the data line DL to the driving thin film transistor T1 according to a scan signal Sn input through the scan line SL.

The storage capacitor Cst may be electrically connected to the switching thin film transistor T2 and the driving voltage line PL, and may store a voltage corresponding to a difference between a voltage received from the switching thin film transistor T2 and the driving voltage ELVDD supplied to the driving voltage line PL.

The driving thin film transistor T1 is electrically connected to the driving voltage line PL and the storage capacitor Cst, and may control a driving current flowing in the organic light-emitting diode OLED from the driving voltage line PL corresponding to a value of the voltage stored in the storage capacitor Cst. The organic light-emitting diode OLED may emit light having a certain brightness by the driving current.

Although FIG. 8 illustrates a case in which the pixel circuit PC may include two thin film transistors and one storage capacitor, the disclosure is not limited thereto.

Referring to FIG. 9, the pixel circuit PC may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

In FIG. 9, signal lines SL, SL−1, SL+1, EL, and DL, an initialization voltage line VL, and the driving voltage line PL are provided for each pixel circuit PC, but the disclosure is not limited thereto. In an embodiment, at least one of signal lines SL, SL−1, SL+1, EL, or DL or/and the initialization voltage line VL may be shared by neighboring pixel circuits PC.

A drain electrode of the driving thin film transistor T1 may be electrically connected to the organic light-emitting diode OLED via the emission control thin film transistor T6. The driving thin film transistor T1 may receive the data signal Dm according to a switching operation of the switching thin film transistor T2 and supply the driving current to the organic light-emitting diode OLED.

A gate electrode and a source electrode of the switching thin film transistor T2 may be electrically connected to the scan line SL and the data line DL, respectively. A drain electrode of the switching thin film transistor T2 may be electrically connected to a source electrode of the driving thin film transistor T1 and may be electrically connected to the driving voltage line PL via the operation control thin film transistor T5.

The switching thin film transistor T2 is turned on according to the scan signal Sn received through the scan line SL and may perform a switching operation of transmitting the data signal Dm received through the data line DL to the source electrode of the driving thin film transistor T1.

A gate electrode of the compensation thin film transistor T3 may be electrically connected to the scan line SL. A source electrode of the compensation thin film transistor T3 is electrically connected to the drain electrode of the driving thin film transistor T1 and may be electrically connected to a pixel electrode of the organic light-emitting diode OLED via the emission control thin film transistor T6. A drain electrode of the compensation thin film transistor T3 may be electrically connected to all of any one electrode of the storage capacitor Cst, a source electrode of the first initialization thin film transistor T4, and a gate electrode of the driving thin film transistor T1. The compensation thin film transistor T3 is turned on according to the scan signal Sn received through the scan line SL and may diode-connect the driving thin film transistor T1 by electrically connecting the gate electrode and the drain electrode of the driving thin film transistor T1 to each other.

A gate electrode of the first initialization thin film transistor T4 may be electrically connected to a previous scan line SL−1. A drain electrode of the first initialization thin film transistor T4 may be electrically connected to the initialization voltage line VL. The source electrode of the first initialization thin film transistor T4 may be electrically connected to all of any one the electrode of the storage capacitor Cst, the drain electrode of the compensation thin film transistor T3, and the gate electrode of the driving thin film transistor T1. The first initialization thin film transistor T4 is turned on according to a previous scan signal Sn−1 received through the previous scan line SL−1 and may perform an initialization operation of initializing a voltage of the gate electrode of the driving thin film transistor T1 by transmitting an initialization voltage Vint to the gate electrode of the driving thin film transistor T1.

A gate electrode of the operation control thin film transistor T5 may be electrically connected to the light-emitting control line EL. A source electrode of the operation control thin film transistor T5 may be electrically connected to the driving voltage line PL. A drain electrode of the operation control thin film transistor T5 may be electrically connected to the source electrode of the driving thin film transistor T1 and the drain electrode of the switching thin film transistor T2.

A gate electrode of the emission control thin film transistor T6 is electrically connected to the light-emitting control line EL. A source electrode of the emission control thin film transistor T6 may be electrically connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 are simultaneously turned on according to an emission control signal En received through the light-emitting control line EL, the driving voltage ELVDD is transmitted to the organic light-emitting diode OLED, and thus the driving current flows in the organic light-emitting diode OLED.

A gate electrode of the second initialization thin film transistor T7 may be electrically connected to a next scan line SL+1. A source electrode of the second initialization thin film transistor T7 may be electrically connected to the pixel electrode of the organic light-emitting diode OLED. A drain electrode of the second initialization thin film transistor T7 may be electrically connected to the initialization voltage line VL. the second initialization thin film transistor T7 is turned on according to a next scan signal Sn+1 received through the next scan line SL+1 and may initialize the pixel electrode of the organic light-emitting diode OLED.

Although FIG. 9 illustrates a case in which the first initialization thin film transistor T4 and the second initialization thin film transistor T7 are electrically connected to the previous scan line SL−1 and the next scan line SL+1, respectively, the disclosure is not limited thereto. In an embodiment, both of the first initialization thin film transistor T4 and the second initialization thin film transistor T7 are electrically connected to the previous scan line SL−1 so as to be driven according to the previous scan signal Sn−1.

Another electrode of the storage capacitor Cst may be electrically connected to the driving voltage line PL. Any one electrode of the storage capacitor Cst may be electrically connected to all of the gate electrode of the driving thin film transistor T1, the drain electrode of the compensation thin film transistor T3, and the source electrode of the first initialization thin film transistor T4.

A counter electrode, for example, a cathode, of the organic light-emitting diode OLED may receive the common voltage ELVSS. The organic light-emitting diode OLED may receive the driving current from the driving thin film transistor T1 and emit light.

The pixel circuit PC is not limited to the number and circuit design of the thin film transistors and the storage capacitor described with reference to FIGS. 8 and 9, the number and circuit design thereof may be variously changed.

Figure 10:
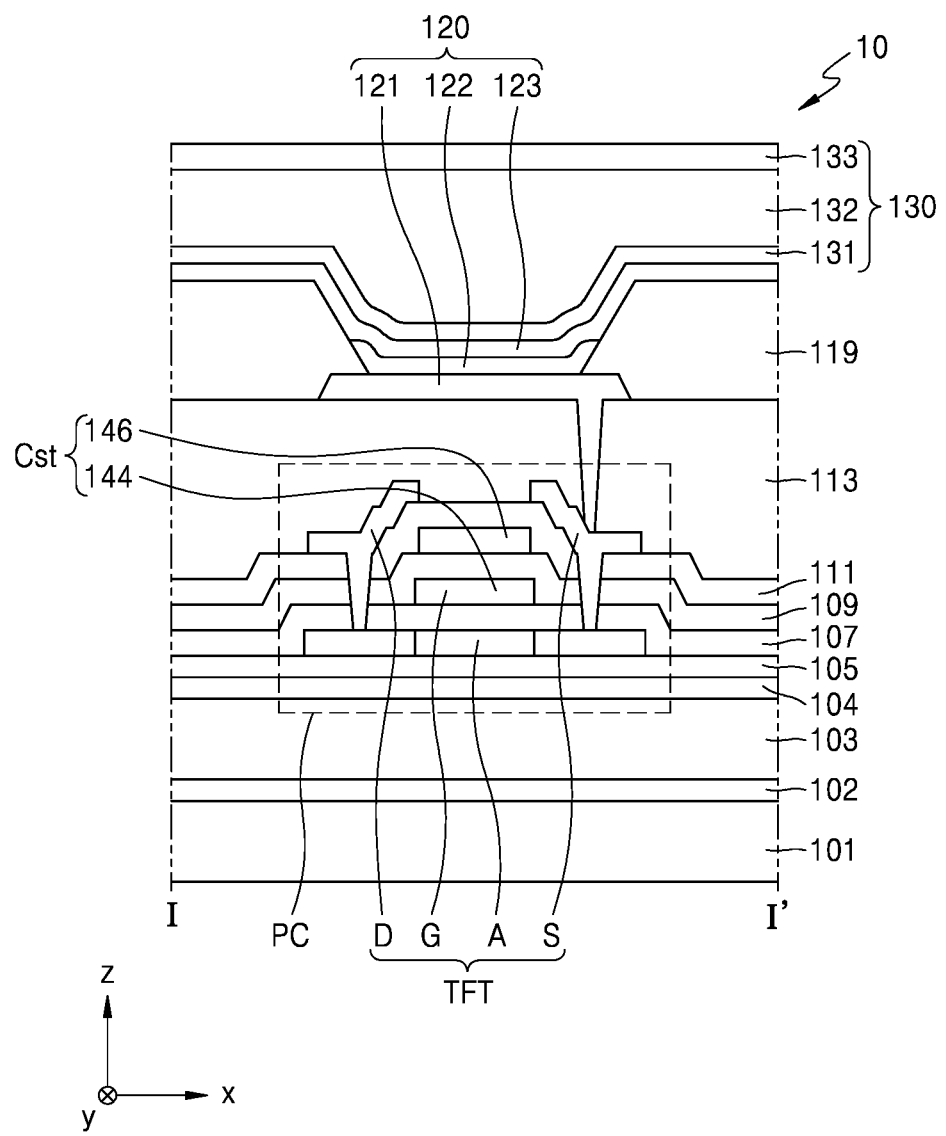
FIG. 10 is a schematic cross-sectional view of a display apparatus according to an embodiment.

FIG. 10 is a schematic cross-sectional view of a display apparatus according to an embodiment. In detail, FIG. 10 is a schematic cross-sectional view taken along line I-I' of FIG. 7.

In the following description, a stack structure of the display panel 10 is briefly described with reference to FIG. 5.

The display panel 10 may include a first base layer 101, a first barrier layer 102, a second base layer 103, and a second barrier layer 104, which may be sequentially stacked each other. The first base layer 101 and the second base layer 103 may include polymer resin having high heat resistance. For example, the first base layer 101 and the second base layer 103 each may include one or more materials selected from the group consisting of polyethersulfone, polyacrylate, polyether imide, polyethylene naphthalate, polyethylene terephthalate, polyphenylene sulfide, polyarylate polyimide, polycarbonate, cellulose triacetate, cellulose acetate propionate, and polyarylene ether sulfone or a combination thereof. In an embodiment, the first base layer 101 and the second base layer 103 each may include polyimide.

The first barrier layer 102 may be arranged or disposed between the first base layer 101 and the second base layer 103. The first barrier layer 102 may be arranged or disposed on the first base layer 101 and may block or reduce intrusion of foreign materials, moisture, or external air from thereunder.

The second barrier layer 104 may be arranged or disposed on the second base layer 103. The second barrier layer 104 may be arranged or disposed on the second base layer 103 and may block or reduce intrusion of foreign materials, moisture, or external air from thereunder.

The first barrier layer 102 and the second barrier layer 104 each may include an inorganic insulating material such as a silicon nitride $SiN_X$, a silicon oxynitride $SiO_XN_Y$, an aluminum oxide $Al_2O_3$, a titanium oxide $TiO_2$, a tantalum oxide $Ta_2O_5$, a hafnium oxide $HfO_2$, or a zinc oxide $ZnO_2$, and the like or a combination thereof within the spirit and the scope of the disclosure. In an embodiment, the first barrier layer 102 and the second barrier layer 104 may include the same or similar material. For example, the first barrier layer 102 and the second barrier layer 104 may include a silicon oxide $SiO_X$. In an embodiment, the first barrier layer 102 and the second barrier layer 104 may include different materials. In an embodiment, the first barrier layer 102 and/or the second barrier layer 104 may be omitted.

A buffer layer 105 may be arranged or disposed on the second barrier layer 104. The buffer layer 105 may be located or disposed above the first base layer 101 and the second base layer 103, and may prevent or reduce intrusion of foreign materials, moisture, or external air from thereunder and may provide a flat upper surface.

The buffer layer 105 may include an inorganic insulating material such as $SiO_X$, $SiO_XN_Y$, $Al_2O_3$, $TiO_2$, $Ta_2O_5$, $HfO_2$, $ZnO_2$, and the like or a combination thereof within the spirit and the scope of the disclosure.

In an embodiment, the buffer layer 105 may include a first buffer layer and a second buffer layer. In an embodiment, the first buffer layer and the second buffer layer may include the same or similar material. In an embodiment, the first buffer layer and the second buffer layer may include different materials.

A thin film transistor TFT and the storage capacitor Cst may be arranged or disposed on the buffer layer 105. The thin film transistor TFT may include a semiconductor layer A, a gate electrode G, a source electrode S, and a drain electrode D. The storage capacitor Cst may include a lower electrode 144 and an upper electrode 146.

In an embodiment, the semiconductor layer A may be arranged or disposed on the buffer layer 105 and may include polysilicon. In an embodiment, the semiconductor layer A may include amorphous silicon. In an embodiment, the semiconductor layer A may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn) or a combination thereof. The semiconductor layer A may include a channel region, and a source region and a drain region that are doped with impurities.

A first insulating layer 107 may be provided or disposed to cover or overlap the semiconductor layer A. The first insulating layer 107 may include an inorganic insulating material such as $SiO_X$, $SiN_X$, $SiO_XN_Y$, $Al_2O_3$, $TiO_2$, $Ta_2O_5$, $HfO_2$, $ZnO_2$, and the like or a combination thereof within the spirit and the scope of the disclosure. The first insulating layer 107 may be a single layer or a multilayer including the above-described inorganic insulating material.

The gate electrode G may be arranged or disposed on the first insulating layer 107 to overlap the semiconductor layer A. The gate electrode G may include molybdenum (Mo), aluminum (Al), copper (Cu), titanium (Ti), and the like, and may be a single layer or multilayer. In an embodiment, the gate electrode G may a Mo single layer.

A second insulating layer 109 may be provided or disposed to cover or overlap the gate electrode G. The second insulating layer 109 may include an inorganic insulating material such as $SiO_X$, $SiN_X$, $SiO_XN_Y$, $Al_2O_3$, $TiO_2$, $Ta_2O_5$, $HfO_2$, $ZnO_2$, and the like or a combination thereof within the spirit and the scope of the disclosure. The second insulating layer 109 may be a single layer or a multilayer including the above-described inorganic insulating material.

The upper electrode 146 of the storage capacitor Cst may be arranged or disposed on the second insulating layer 109. The upper electrode 146 may overlap the gate electrode G arranged or disposed thereunder. The gate electrode G and the upper electrode 146 overlapping each other with the second insulating layer 109 therebetween may form the storage capacitor Cst. In an embodiment, the gate electrode G may be the lower electrode 144 of the storage capacitor Cst. In an embodiment, the lower electrode 144 of the storage capacitor Cst may be provided as a separate independent constituent element.

The upper electrode 146 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or a multilayer including the above-described materials or a combination thereof.

A third insulating layer 111 may be formed or disposed to cover or overlap the upper electrode 146. The third insulating layer 111 may include an inorganic insulating material such as $SiO_X$, $SiN_X$, $SiO_XN_Y$, $Al_2O_3$, $TiO_2$, $Ta_2O_5$, $HfO_2$, $ZnO_2$, and the like or a combination thereof within the spirit and the scope of the disclosure. The third insulating layer 111 may be a single layer or a multilayer including the above-described inorganic insulating materials.

The source electrode S and the drain electrode D may be arranged or disposed on the third insulating layer 111. The source electrode S and the drain electrode D may include a conductive material including Mo, Al, Cu, Ti, and the like, and may be a multilayer or single layer including the above-described materials or a combination thereof. In an embodiment, the source electrode S and the drain electrode D may have a multilayer structure of Ti/Al/Ti.

A planarization layer 113 may be arranged or disposed to cover or overlap the source electrode S and the drain electrode D. The planarization layer 113 may have a flat upper surface so that a pixel electrode 121 arranged or disposed thereon is formed flat.

The planarization layer 113 may include an organic material or an inorganic material, and may have a single layer structure or a multilayer structure. The planarization layer 113 may include benzocyclobutene (BCB), polyimide, hexamethyldisiloxane (HMDSO), a general purpose polymer such as polymethylmethacrylate (PMMA) or polystyrene (PS), a polymer derivative having a phenolic group, acrylic polymer, imide polymer, aryl ether polymer, amide polymer, fluorine polymer, p-xylene polymer, vinyl alcohol polymer, and the like or a combination thereof within the spirit and the scope of the disclosure. The planarization layer 113 may include an inorganic insulating material such as $SiO_X$, $SiN_X$, $SiO_XN_Y$, $Al_2O_3$, $TiO_2$, $Ta_2O_5$, $HfO_2$, $ZnO_2$, and the like or a combination thereof within the spirit and the scope of the disclosure. In a case that the planarization layer 113 is formed, to provide a planarized upper surface after a layer is formed, chemical mechanical polishing may be performed on an upper surface of the layer.

The planarization layer 113 may have a via hole for exposing any one of the source electrode S and the drain electrode D of the thin film transistor TFT, and the pixel electrode 121 may be in electrical contact with the source electrode S or the drain electrode D, via the via hole, so as to be electrically connected to the thin film transistor TFT.

In an embodiment, the planarization layer 113 may include a first planarization layer and a second planarization layer. In an embodiment, the first planarization layer and the second planarization layer may include the same or similar material. In an embodiment, the first planarization layer and the second planarization layer may include different materials. As the planarization layer 113 may include the first planarization layer and the second planarization layer, a level of integration of a display apparatus may be improved.

The pixel electrode 121 may be arranged or disposed on the planarization layer 113. The pixel electrode 121 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). The pixel electrode 121 may include a reflective film including Ag, Mg, Al, Pt, Pd, Au, Ni, Nd, Ir, Cr, or a compound thereof. For example, the pixel electrode 121 may have a structure in which films including ITO, IZO, ZnO, or $In_2O_3$ are provided or disposed above or under or below the above-described reflective film. The pixel electrode 121 may have a stack structure of ITO/Ag/ITO.

A pixel definition layer 119 may be arranged or disposed on the planarization layer 113. The pixel definition layer 119 that is deposed on the planarization layer 113 may cover or overlap an edge of the pixel electrode 121. An opening for exposing at least a part of the pixel electrode 121 may be defined in the pixel definition layer 119.

The pixel definition layer 119 may prevent generated of arc, and the like at an edge of the pixel electrode 121 by increasing a distance between the edge of the pixel electrode 121 and a counter electrode 123 on the pixel electrode 121. The pixel definition layer 119 may include an organic insulating material such as polyimide, polyamide, acryl resin, BCB, HMDSO, phenol resin, and the like, and may be formed by a method such as spin coating, and the like within the spirit and the scope of the disclosure.

Although not illustrated, a spacer for preventing mask scratches may be further be provided or disposed on the pixel definition layer 119. The spacer may be integral with the pixel definition layer 119. For example, the spacer and the pixel definition layer 119 may be simultaneously formed in the same process by using a halftone mask process.

An intermediate layer 122 may be arranged or disposed in the opening of the pixel definition layer 119 to correspond to the pixel electrode 121. The intermediate layer 122 may include a light-emitting layer. The light-emitting layer may include a polymer organic material or a low molecular weight organic material, and may emit red, green, blue, or white light.

In an embodiment, the intermediate layer 122 may further include an organic functional layer arranged or disposed above and/or under or below the light-emitting layer. The organic functional layer may include a first functional layer and/or a second functional layer. In an embodiment, the first functional layer and/or the second functional layer may be omitted.

The first functional layer may be arranged or disposed under or below the light-emitting layer. The first functional layer may be a single layer or multilayer including an organic material. The first functional layer may be a hole transport layer (HTL) that is a single layer structure. For example, the first functional layer may include a hole injection layer (HIL) and a hole transport layer (HTL).

The second functional layer may be arranged or disposed above the light-emitting layer. The second functional layer may be a single layer or multilayer including an organic material. The second functional layer may include an electron transport layer (ETL) and/or an electron injection layer (EIL).

The counter electrode 123 may be arranged or disposed on the intermediate layer 122. The counter electrode 123 may include a conductive material having a low work function. For example, the counter electrode 123 may include a (semi-) transparent layer including Ag, Mg, Al, Pt, Pd, Au, Ni, Nd, Ir, Cr, lithium (Li), Ca, or an alloy thereof, and the like or a combination thereof within the spirit and the scope of the disclosure. For example, the counter electrode 123 may further include a layer including ITO, IZO, ZnO or $In_2O_3$ on the (semi-) transparent layer including the above-described materials or a combination thereof.

In an embodiment, the layers from the pixel electrode 121 to the counter electrode 123 may constitute an organic light-emitting diode 120.

A capping layer (not shown) including an organic material may be formed or disposed on the counter electrode 123. The capping layer may be a layer provided to protect the counter electrode 123 and simultaneously increase light extraction efficiency. The capping layer may include an organic material having a refractive index higher than the counter electrode 123.

A thin film encapsulation layer 130 as a sealing member may be arranged or disposed above the organic light-emitting diode 120 of the display apparatus 1. In other words, the organic light-emitting diode 120 may be sealed by the thin film encapsulation layer 130. The thin film encapsulation layer 130 may be arranged or disposed on the counter electrode 123. The thin film encapsulation layer 130 may prevent or reduce intrusion of external moisture or foreign materials into the organic light-emitting diode 120. The thin film encapsulation layer 130 may include at least one inorganic film layer and at least one organic film layer.

In an embodiment, the thin film encapsulation layer 130 may include a first inorganic film layer 131, an organic film layer 132, and a second inorganic film layer 133, which may be sequentially stacked each other. In an embodiment, the number of organic encapsulation layers, the number of inorganic encapsulation layers, and the stacking order may be changed.

The first inorganic film layer 131 and the second inorganic film layer 133 each may include one or more inorganic insulating materials such as $SiO_X$, $SiN_X$, $SiO_XN_Y$, $Al_2O_3$, $TiO_2$, $Ta_2O_5$, $HfO_2$, $ZnO_2$, and the like, and may be formed by chemical vapor deposition (CVD), and the like within the spirit and the scope of the disclosure. The organic film layer 132 may include a polymeric material. The polymeric material may include silicon resin, acryl resin, epoxy resin, polyimide, polyethylene, and the like or a combination thereof within the spirit and the scope of the disclosure.

According to the above-described embodiments of the disclosure, as the film including an elastomeric material, and the adhesive layer having shear thickening characteristics, are arranged or disposed on the display panel, the display panel may be prevented or reduced from being damaged by external impact, and simultaneously the folding characteristics and impact resistance of the display apparatus may be improved. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display panel that is foldable and including a display element;
   a first film comprising an elastomeric material and disposed on the display panel, the first film having a first thickness;
   a first adhesive layer disposed on the first film, the first adhesive layer having a second thickness and the first adhesive layer further having a storage modulus of about 10 kPa or more at about 100 Hz or more and about 100 Pa or less at about 1 Hz or less; and
   a second adhesive layer disposed between the display panel and the first film and having a third thickness equal to or greater than the second thickness of the first adhesive layer.

2. The display apparatus of claim 1, wherein an elastic modulus of the first film at about −20° C. is in a range of about 200 MPa to about 2,000 MPa.

3. The display apparatus of claim 2, wherein an elastic modulus of the first film at about 85° C. is in a range of about 100 MPa to about 500 MPa.

4. The display apparatus of claim 1, wherein the first thickness of the first film is in a range of about 50 μm to about 150 μm.

5. The display apparatus of claim 1, wherein the first film has a recovery rate of about 50% or more.

6. The display apparatus of claim 1, wherein the first adhesive layer has shear thickening characteristics causing an increase in the storage modulus in response to an applied stress.

7. The display apparatus of claim 6, wherein the second adhesive layer has shear thickening characteristics.

8. The display apparatus of claim 1, wherein a storage modulus of the first adhesive layer at about −20° C. is about 100 KPa or less.

9. The display apparatus of claim 8, wherein a storage modulus of the second adhesive layer at about −20° C. is about 100 KPa or less.

10. The display apparatus of claim 7, wherein a storage modulus of the second adhesive layer at about −20° C. is equal to or greater than a storage modulus of the first adhesive layer at about −20° C.

11. The display apparatus of claim 1, wherein the second thickness of the first adhesive layer is in a range of about 10 μm to about 50 μm.

12. The display apparatus of claim 1, wherein the third thickness of the second adhesive layer is in a range of about 10 μm to about 50 μm.

13. The display apparatus of claim 1, further comprising a second film disposed on the first adhesive layer, the second film having a fourth thickness.

14. The display apparatus of claim 13, wherein the fourth thickness of the second film is about 50 μm or less.

15. The display apparatus of claim 1, further comprising a third film disposed between the first film and the display panel, the third film having a fifth thickness less than the first thickness of the first film.

16. The display apparatus of claim 15, wherein the fifth thickness of the third film is about 50 μm or less.

17. The display apparatus of claim 15, further comprising a third adhesive layer disposed between the third film and the display panel, the third adhesive layer having a sixth thickness equal to or greater than the third thickness of the second adhesive layer.

18. The display apparatus of claim 17, wherein the sixth thickness of the third adhesive layer is in a range of about 10 μm to about 75 μm.

19. The display apparatus of claim 17, wherein the third adhesive layer has shear thickening characteristics.

20. The display apparatus of claim 11, wherein the display element comprises an organic light-emitting diode.

21. The display apparatus of claim 1, wherein
the second adhesive layer directly contacts the display panel and the first film; and
the first adhesive layer directly contacts the first film.

* * * * *